(12) United States Patent
Ansari et al.

(10) Patent No.: US 12,055,572 B2
(45) Date of Patent: Aug. 6, 2024

(54) PORTABLE SYNC MODULE

(71) Applicant: Saudi Arabian Oil Company, Dhahran (SA)

(72) Inventors: Abdulaziz A. Ansari, Abqaiq (SA); Syed Kashif, Abqaiq (SA); Mohammed Abdulkhaliq A Humhum, Abqaiq (SA)

(73) Assignee: Saudi Arabian Oil Company, Dhahran (SA)

( * ) Notice: Subject to any disclaimer, the term of this patent is extended or adjusted under 35 U.S.C. 154(b) by 149 days.

(21) Appl. No.: 17/707,578

(22) Filed: Mar. 29, 2022

(65) Prior Publication Data

US 2023/0314494 A1 Oct. 5, 2023

(51) Int. Cl.
*G01R 25/00* (2006.01)
*H02J 3/08* (2006.01)

(52) U.S. Cl.
CPC .............. *G01R 25/005* (2013.01); *H02J 3/08* (2013.01)

(58) Field of Classification Search
CPC ................................ G01R 25/005; H02J 3/08
See application file for complete search history.

(56) References Cited

U.S. PATENT DOCUMENTS

| | | | | |
|---|---|---|---|---|
| 3,737,671 | A * | 6/1973 | Davis | G01R 11/60 307/149 |
| 4,538,197 | A | 8/1985 | Breen | |
| 10,694,562 | B2 * | 6/2020 | Su | H04W 8/005 |
| 2003/0185553 | A1 * | 10/2003 | Kameyama | G03B 15/05 396/206 |
| 2011/0187194 | A1 * | 8/2011 | Keimling | H02J 9/06 307/64 |
| 2013/0303081 | A1 * | 11/2013 | Chang | H04W 36/0061 455/524 |
| 2014/0268430 | A1 * | 9/2014 | Bourgeau | H02H 7/28 361/65 |
| 2021/0084603 | A1 * | 3/2021 | Zisimopoulos | H04B 7/155 |
| 2021/0126454 | A1 * | 4/2021 | Upreti | H02J 13/00007 |

OTHER PUBLICATIONS electricalpartmanuals.com [online], "Circuit Shield Type 25S and 25V Synchronism Check Relays, ABB Descriptive Bulletin 41-611S," Sep. 1995, retrieved on Feb. 10, 2022, retrieved from URL <https://www.electricalpartmanuals.com/pdf/relaysAndMeters/ABB/Relays/DB-41-611S.pdf>, 3 pages.
My protectionguide.com [online], "Type KAVS 100 Synchronism Check Relay, Service Manual," Jun. 2017, retrieved on Feb. 10, 2022, retrieved from URL <https://www.myprotectionguide.com/uploads/7/3/0/1/73017921/kavs_100_check_synchronism_relay_service_manual.pdf>, 100 pages.
te.com [online], "TE Connectivity Protective Relays datasheet," 2022, retrieved on Feb. 10, 2022, retrieved from URL <https://www.te.com/commerce/DocumentDelivery/DDEController?Action=showdoc&DocId=Catalog+Section%7F5-1773450-5_sec11_KILOVAC_WD%7F1218%7Fpdf%7FEnglish%7FENG_CS_5-1773450-5_sec11_KILOVAC_WD_1218.pdf%7F1-1618058-2>, 9 pages.

* cited by examiner

*Primary Examiner* — Dominic E Hawkins
(74) *Attorney, Agent, or Firm* — Fish & Richardson P.C.

(57) ABSTRACT

The subject matter of this specification can be embodied in, among other things, an apparatus having a housing, a first electrical input port, a second electrical input port, at least one trigger output port, and a synchronization check relay arranged at least partly within the housing and in electrical communication with the first electrical input port, the second electrical input ports, and the at least one trigger output port.

18 Claims, 5 Drawing Sheets

PORTABLE SYNC MODULE

TECHNICAL FIELD

This instant specification relates to a portable synchro check relay system.

BACKGROUND

When connecting two separate AC busses, it is important to make sure that the power signals on the two busses are synchronized before being connected together. Failure to do so can result in large electrical discontinuities that can be dangerous at the connection site as well as upstream and downstream from the connection site.

Synchro check relays (also known as sync check relays, sync relays, and ANSI type 25 relays) are relays that are designed to be used when two separate AC electrical networks or two electrically interconnected network sections are to be connected together. This type of relay monitors the voltages on both sides of a circuit breaker and allows the circuit breaker to close only if the voltages on both sides of the circuit breaker fulfill predetermined conditions such as phase difference, magnitude difference, and frequency difference. Synchro check relays are typically installed in fixed (stationary or substantially permanent) configurations, such as a part of a control panel in a control room.

SUMMARY

The present disclosure describes synchro check relays configured for use as portable modules.

In an example implementation, an apparatus includes a housing, a first electrical input port, a second electrical input port, at least one trigger output port, and a synchronization check relay arranged at least partly within the housing and in electrical communication with the first electrical input port, the second electrical input ports, and the at least one trigger output port.

Various implementations can include some, all, or none of the following features. The synchronization check relay can be configured to compare one or more of a first voltage, a first phase angle, a first frequency, and a first phase rotation of a first electrical signal in electrical communication with the first electrical input port with a corresponding one or more of a second voltage, a second phase angle, a second frequency, and a second phase rotation of a second electrical signal in electrical communication with the second electrical input port, and provide a trigger signal at the trigger output port based on the comparing. The comparing can include one or more of determining that the first voltage and the second voltage are within a predetermined voltage difference threshold, determining that the first phase angle and the second phase angle are within a predetermined phase angle difference threshold, determining that the first frequency and the second frequency are within a predetermined frequency difference threshold, and determining that the first phase rotation matches the second phase rotation. The apparatus can include an indicator arranged at least partly in the housing and configured to provide an indication based on the trigger signal. The apparatus can include a power inlet port, and a power switch arranged at least partly in the housing and configured to switch power to the synchronization check relay. The apparatus can include one or both of a first display arranged at least partly in the housing and configured to display one or more of a first voltage, a first phase angle, a first frequency, and a first phase rotation of a first electrical signal in electrical communication with the first electrical input port, and a second display arranged at least partly in the housing and configured to display one or more of a second voltage, a second phase angle, a second frequency, and a second phase rotation of a second electrical signal in electrical communication with the second electrical input port. The first electrical input port can be configured to removably electrically connect to a first power transducer, and the second electrical input port is configured to removably electrically connect to a second power transducer. The first electrical input port can include two inputs configured to receive two input signals representative of two phases of a multiphase electrical bus. The second electrical input port can include two inputs configured to receive two input signals representative of two phases of a multiphase electrical bus.

In another example implementation, a method of monitoring two electrical busses includes removably electrically connecting a synchronization check relay to a power source to receive operational power, removably electrically connecting a first electrical signal representative of a first power signal on a first electrical bus to a first electrical input port arranged in a housing and in electrical communication with a first sense input port of the synchronization check relay, removably electrically connecting a second electrical signal representative of a second power signal on a second electrical bus to a second electrical input port arranged in the housing and in electrical communication with a second sense input port of the synchronization check relay, comparing, by the synchronization check relay, the first electrical signal and the second electrical signal, determining, based on the comparing, electrical synchronization of the first electrical signal and the second electrical signal, and providing a trigger signal based on the determining.

Various implementations can include some, all, or none of the following features. The method can include removably electrically connecting a control input of a controllable switch to a trigger output port arranged in the housing and in electrical communication with a signal output port of the synchronization check relay, where the synchronization check relay can be configured to provide the trigger signal at the signal output port. The method can include electrically connecting, by the controllable switch based on the trigger signal, the first electrical bus to the second electrical bus. The method can include displaying information representative of one or more of a first voltage of the first power signal based on the first electrical signal, a first phase angle of the first power signal based on the first electrical signal, a first frequency of the first power signal based on the first electrical signal, a first phase rotation of the first electrical signal based on the first electrical signal, a second voltage of the second power signal based on the second electrical signal, a second phase angle of the second power signal based on the second electrical signal, a second frequency of the second power signal based on the second electrical signal, and a second phase rotation of the second electrical signal based on the second electrical signal. The method can include providing an indication based on the determining. The method can include actuating a power switch configured to selectably open and close an electrical circuit between the power source and the synchronization check relay. The first electrical signal can include a first phase signal representative of a first phase of power on the first electrical bus and a second phase signal representative of a second phase of power on the first electrical bus, and the second electrical signal can include a third phase signal representative of a third phase of power on the second electrical bus and a fourth phase signal representative of a fourth phase of power on the second electrical bus. The method can include disconnecting a second synchronization check relay from the first electrical signal and the second electrical signal before connecting the first electrical input port to the first electrical signal and before connecting the second electrical input port to the second electrical signal.

In another example implementations, a synchronization check relay system includes a housing, a first reception means for receiving a first measurement signal based on a first power signal of a first electrical bus, and arranged at least partly within the housing, a second reception means for receiving a second measurement signal based on a second power signal of a second electrical bus, and arranged at least partly within the housing, a determination means for determining electrical synchronization between the first power signal and the second power signal based on the first measurement signal and the second measurement signal, and an output means for providing a trigger signal indicative of determined electrical synchronization between the first power signal and the second power signal.

Various implementations can include, some, all, or none of the following features. The synchronization check relay system can include a power means for receiving power from a power source and distributing received power to the determination means. The synchronization check relay system can include a communication means for providing information to a user about one or more of a first voltage of the first power signal, a first phase angle of the first power signal, a first frequency of the first power signal, a first phase rotation of the first electrical signal, a second voltage of the second power signal, a second phase angle of the second power signal, a second frequency of the second power signal, and a second phase rotation of the second electrical signal.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method/the instructions stored on the non-transitory, computer-readable medium.

The subject matter described in this specification can be implemented in particular implementations, so as to realize one or more of the following advantages. First, the system can provide a portable solution for temporarily replacing a failed synchro check relay. Second, the system can improve operational uptime of systems that implement synchro check relays. Third, the system can be used in place of a large variety of manufacturer-specific synchro check relay types.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

Like reference numbers and designations in the various drawings indicate like elements.

DETAILED DESCRIPTION

The following detailed description describes a synchronization check relay system configured for portable use. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

Existing synchro check relays are typically installed in fixed (stationary or substantially permanent) configurations, such as a part of a control panel in a control room, where the relay is permanently or semi-permanently connected to signals representing the electrical networks that are being monitored, outputs that can be actuated to effect interconnection of the networks, sources of power for operating the relay itself, as well as controls and displays. Existing synchro check relays are made by a variety of manufacturers, and come in a variety of shapes, sizes, and have a variety of specific electrical connection layouts.

When an existing synchro check relay fails, the typical solution is to replace it with another of the same make and model. However, given the variety of synchro check relays that exist, it may be impractical to stock spares for every different type of relay in use at a particular location, and it may take considerable time in order to source, ship, and install an exact or appropriate drop-in replacement. Another solution is to replace the failed relay with a different one, although this solution may require additional work in order to modify the wiring and physical mounting of the relay in addition to the sourcing and shipping problems discussed previously. Such delays can create unacceptable amounts of system downtime, and such delays can become even longer if the failure occurs at a remote installation.

In general, this document describes systems and techniques for providing portable synchro check relay modules that can be used as temporary or permanent replacements for failed fixed or stationary synchro check relays. In general, such synchro check relay modules can be wired in place of, or in parallel with, a failed synchro check relay in order to return an interconnection system to operation, for example, until an exact or appropriate replacement for the failed unit can be installed or otherwise replaced.

Figure 1:
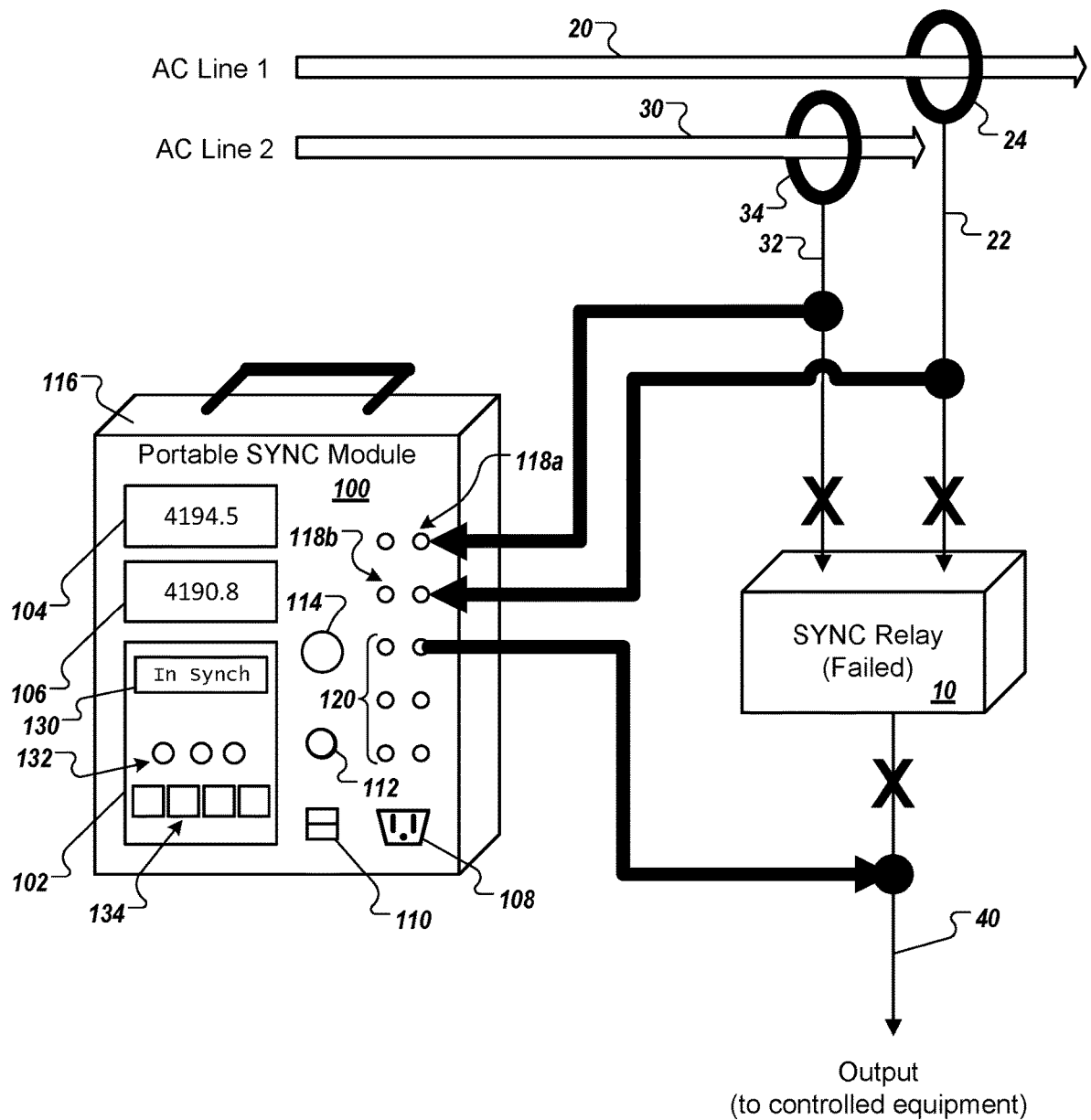
FIG. 1 is a conceptual block diagram that shows an example of a synchro check relay module configured for portable use according to some implementations of the present disclosure.

FIG. 1 is a conceptual block diagram that shows an example of a portable synchro check relay module 100 configured for portable use according to some implementations of the present disclosure. In general, the portable synchro check relay module 100 is configured to be used as a portable, temporary field replacement for failed or otherwise non-functional synchro check relays, for example, until a more permanent solution or replacement for the failed unit can be installed.

The synchro check relay 10 is configured to monitor an electrical network 20 (such as a first AC bus) based on a signal 22 provided by a power transducer 24 configured to sense a power signal of the electrical network 20. The synchro check relay 10 is configured to also monitor an electrical network 30 (such as a second AC bus) based on a signal 32 provided by a power transducer 34 configured to sense a power signal of the electrical network 30. The synchro check relay 10 is configured to monitor the signals 22 and 32 provide an output signal 40 (for example, to a controllable relay configured to interconnect the electrical networks 20 and 30) only if the voltages on both of the electrical networks 20 and 30 fulfill predetermined conditions such as phase difference, magnitude difference, and frequency difference.

For purposes of discussion, the synchro check relay 10 can be a semi-permanently installed relay. For example, the synchro check relay 10 may be mounted to a control panel through a hole having a device-specific shape, or the synchro check relay 10 may be connected to a wiring harness or plug that is specific to that particular installation. In the illustrated example, a synchro check relay 10 is failed or is otherwise inoperable.

The portable synchro check relay module 100 includes a synchro check relay 102, a meter 104, a meter 106, a power inlet port 108, a power switch 110, a replaceable fuse 112 (or circuit breaker), and an indicator 114, housed at least partly in or on a portable enclosure 116. The portable synchro check relay module 100 also includes an electrical input port 118a, an electrical input port 118b, and a collection of electrical output ports 120.

The synchro check relay 102 is configured to monitor signals provided to the electrical input ports 118a and 118b to compare one or more of a first voltage, a first phase angle, a first frequency, and a first phase rotation of a first electrical signal in electrical communication with the electrical input port 118a with a corresponding one or more of a second voltage, a second phase angle, a second frequency, and a second phase rotation of a second electrical signal in electrical communication with the electrical input port 118b, and provide the output signal 40 on one or more of the electrical output ports 120 based on the comparing, for example, if the voltages sensed at both of the electrical input ports 118a and 118b fulfill predetermined conditions such as phase difference, magnitude difference, and frequency difference. The synchro check relay 102 can be configured to provide both auto-reclose and manual circuit breaker closing schemes.

The synchro check relay 102 includes a display 130, a collection of indicators 132, and a collection of input buttons 134. In use, an operator can configure the synchro check relay 102 using the input buttons 134 and receive visual feedback from the display 130 and the indicators 132.

In the illustrated example, the electrical input port 118a is removably electrically connected to the power transducer 34 in order to receive the signal 32, and the electrical input port 118b is removably electrically connected to the power transducer 24 in order to receive the signal 22. One or more of the electrical output ports 120 is electrically connected an output (for example, a controllable relay configured to interconnect the electrical networks 20 and 30) in order to provide the output signal 40. In the illustrated example, the portable synchro check relay module 100 effectively bypasses the failed synchro check relay 10.

The meter 104 is configured to display information about signals received at the electrical input port 118a (such as voltage, phase angle, phase rotation, current, and frequency). The meter 106 is configured to display information about signals received at the electrical input port 118b (such as voltage, phase angle, phase rotation, current, and frequency).

The power inlet port 108 is configured to be connected to a source of electrical power to operate the components of the portable synchro check relay module 100 (such as about 57 VAC to about 250VAC power from a wall outlet), and the power switch 110 is configured to switch power from the power inlet port 108 to the rest of the components of the portable synchro check relay module 100. The fuse 112 is configured to provide overcurrent protection for the components of the portable synchro check relay module 100. The indicator 114 is configured to illuminate or otherwise indicate that signals 32 and 22 are in synchronism. In some embodiments, the power inlet port 108 can include another fuse.

Figure 2:
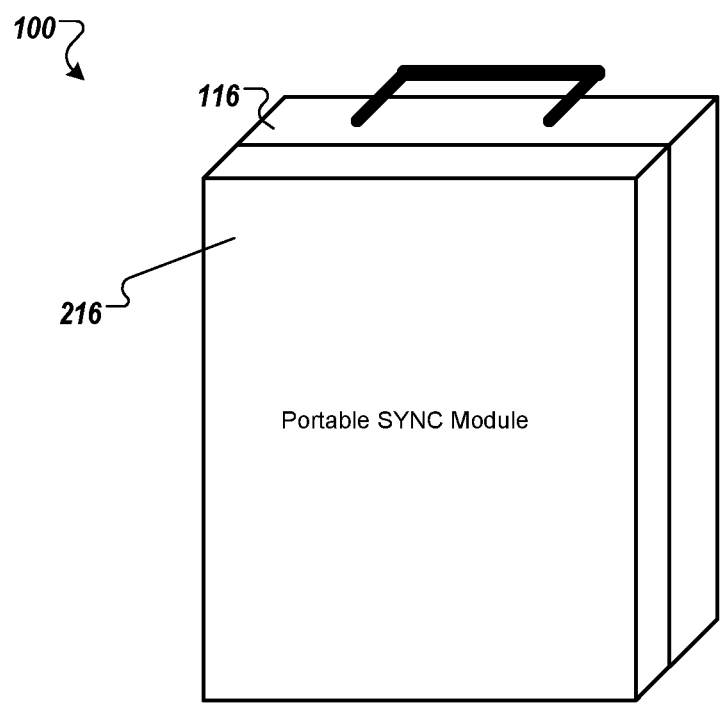
FIG. 2 shows an example of the example portable synchro check relay module of FIG. 1 in an enclosed configuration.

FIG. 2 shows an example of the example portable synchro check relay module 100 of FIG. 1 in an enclosed configuration. The portable synchro check relay module 100 includes a cover 216 that is configured to cover or otherwise provide protection for the exposed portions of the synchro check relay 102, the meters 104 and 106, the power inlet port 108, the power switch 110, the replaceable fuse, the indicator 114, the electrical input ports 118a and 118b, and the electrical output ports 120. In some implementations, the cover may be removably affixed to the portable enclosure 116 during storage or transport, and removed when the portable synchro check relay module 100 is put into service.

Figure 3:
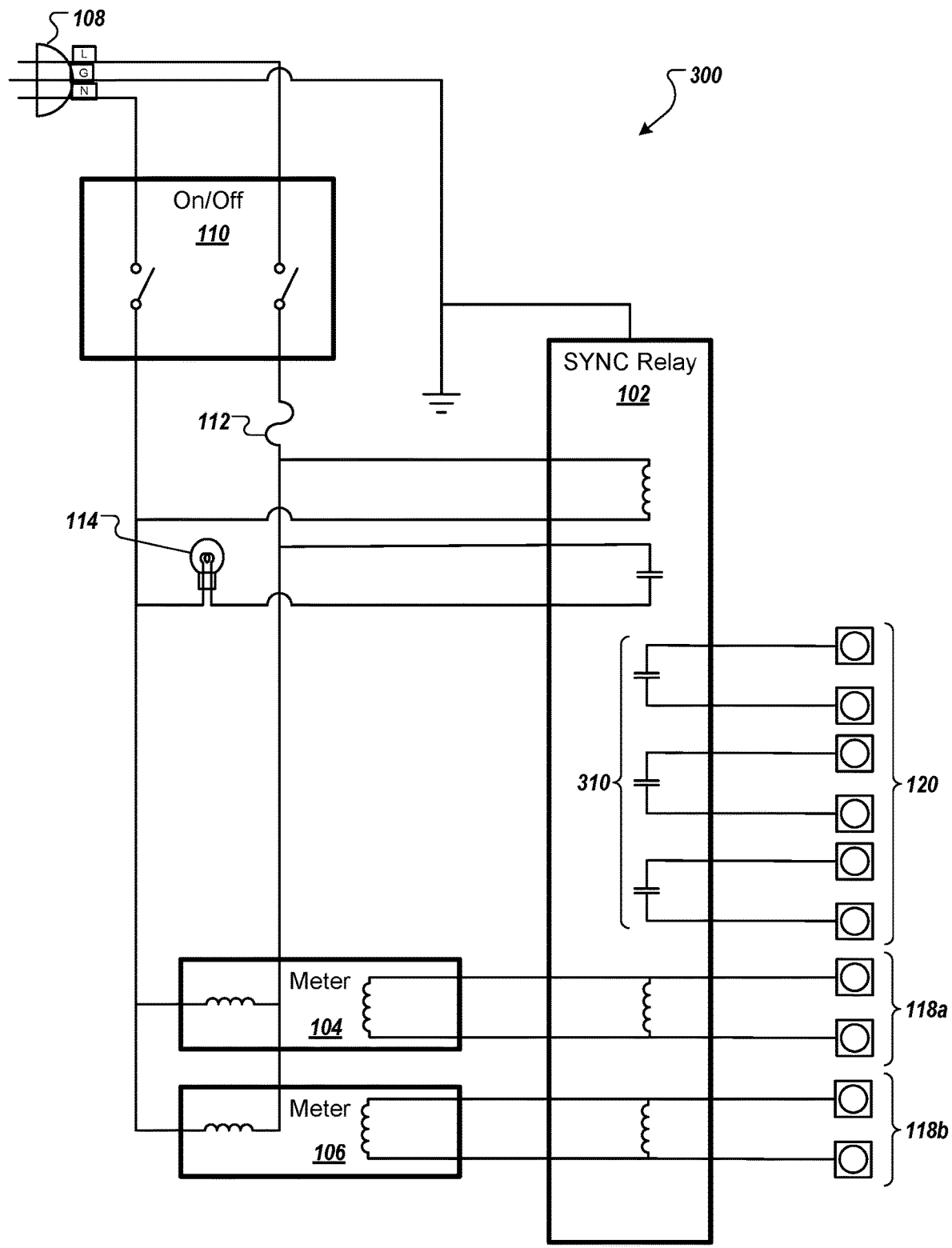
FIG. 3 is schematic diagram of an example circuit of the example synchro check relay module of FIG. 1.

FIG. 3 is schematic diagram of an example circuit 300 of the example portable synchro check relay module 100 of FIG. 1. In the illustrated example, the synchro check relay 102, the meters 104 and 106, the power inlet port 108, the power switch 110, the replaceable fuse 112, the indicator 114, the electrical input ports 118a and 118b, and the electrical output ports 120 are shown in schematic form.

In some embodiments, the synchro check relay 102 and the meters 104 and 106 can be configured to operate on input voltages ranging from about 57 VAC to about 250 VAC.

The synchro check relay 102 is configured such that the electrical input ports 118a and 118b can be connected in either a phase-phase or phase-ground configuration. Each of the electrical input ports 118a and 118b include two inputs configured to receive two input signals representative of two phases of a multiphase electrical bus, or receive one input signal representative of one phase of a multiphase electrical bus on one input and be connected to ground at the other input. The synchro check relay 102 includes a collection of dry output contacts 310 to use for synch applications and annunciation. In some embodiments, the operation time for one or more of the output contacts 310 can be set to one second (1000 ms). In some implementations, the output contacts 310 can be useable for both AC and DC control schemes.

In some implementations, the synchro check relay 102 can be a TYPE KAVS 100 synchronism check relay, manufactured by AREVA S.A.

Figure 4:
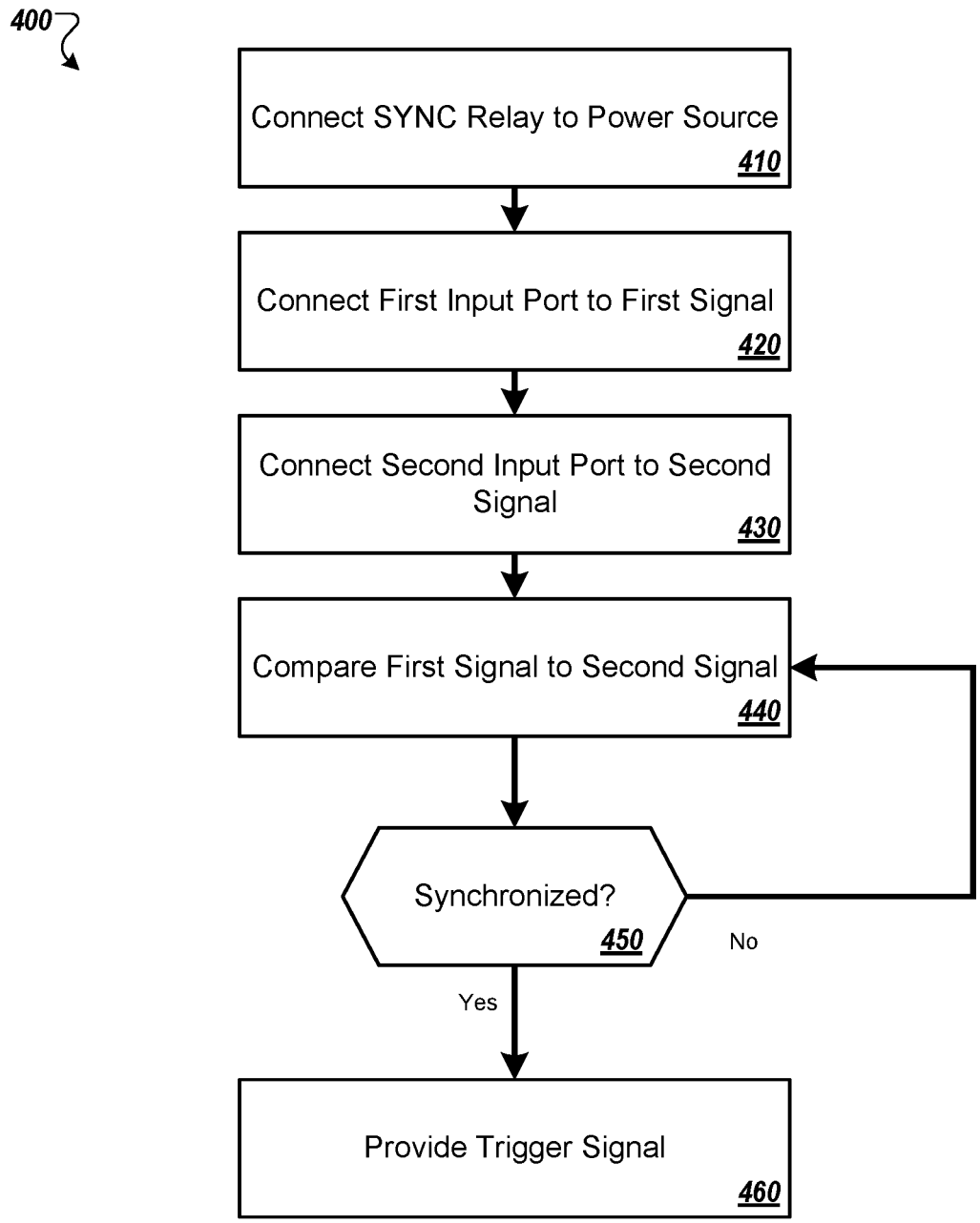
FIG. 4 is flow chart that shows an example of a process for using an example synchro check relay module, such as the example synchro check relay module of FIG. 1.

FIG. 4 is flow chart that shows an example of a process 400 for using an example synchro check relay module, such as the example portable synchro check relay module 100 of FIG. 1.

At 410, a synchronization check relay is removably electrically connected to a power source to receive operational power. For example, the power inlet port 108 can be connected to a wall outlet or other source operational power for the portable synchro check relay module 100.

At 420, a first electrical signal representative of a first power signal on a first electrical bus is removably electrically connected to a first electrical input port arranged in a housing and in electrical communication with a first sense input port of the synchronization check relay. For example, the electrical input port 118*a* can be temporarily connected to the signal 32 by a set of patch cables or other appropriate electrical interconnects.

At 430, a second electrical signal representative of a second power signal on a second electrical bus is removably electrically connected to a second electrical input port arranged in the housing and in electrical communication with a second sense input port of the synchronization check relay. For example, the electrical input port 118*b* can be temporarily connected to the signal 32 by a set of patch cables or other appropriate electrical interconnects.

At 440, the synchronization check relay compares the first electrical signal and the second electrical signal. For example, the synchro check relay 102 can compare the signal 32 and the signal 22 to determine one or more of whether the voltages represented by the signals 32 and 22 are within a predetermined voltage difference threshold, whether the phase angles represented by the signals 32 and 22 are within a predetermined phase angle difference threshold, whether the frequencies represented by the signals 32 and 22 are within a predetermined frequency difference threshold, and whether the phase rotation represented by the signal 32 matches the phase rotation represented by the signal 22.

At 450, electrical synchronization of the first electrical signal and the second electrical signal is determined based on the comparing. For example, the synchro check relay 102 can determine if the signal 32 and the signal 22 indicate that the electrical networks 20 and 30 are in electrical synchronism. If the first signal and the second signal are not synchronized, then the signals are compared again at 440. If the first signal and the second signal are synchronized, then at 460 a trigger signal is provided based on the determining. For example, a signal can be provided at one or more of the electrical output ports 120.

In some implementations, the process 400 can include removably electrically connecting a control input of a controllable switch to a trigger output port arranged in the housing and in electrical communication with a signal output port of the synchronization check relay, where the synchronization check relay is configured to provide the trigger signal at the signal output port. In some implementations, the process 400 can include electrically connecting, by the controllable switch based on the trigger signal, the first electrical bus to the second electrical bus. For example, the output signal 40 can be connected to electrical switchgear configured to interconnect the electrical networks 20 and 30 in response to the output signal 40.

In some implementations, the process 400 can include displaying information representative of one or more of a first voltage of the first power signal based on the first electrical signal, a first phase angle of the first power signal based on the first electrical signal, a first frequency of the first power signal based on the first electrical signal, a first phase rotation of the first electrical signal based on the first electrical signal, a second voltage of the second power signal based on the second electrical signal, a second phase angle of the second power signal based on the second electrical signal, a second frequency of the second power signal based on the second electrical signal, and a second phase rotation of the second electrical signal based on the second electrical signal. For example, the meter 104 can display information based on the signal 32, and the meter 106 can display information about the signal 22.

In some implementations, the process 400 can include providing an indication based on the determining. For example, the synchro check relay 102 can illuminate the indicator 114 when synchronism of the signals 22 and 32 is detected.

In some implementations, the process 400 can include actuating a power switch configured to selectably open and close an electrical circuit between the power source and the synchronization check relay. For example, an operator can flip the power switch 110 to turn the portable synchro check relay module 100 on and off.

In some implementations, the first electrical signal can be a first phase signal representative of a first phase of power on the first electrical bus and a second phase signal representative of a second phase of power on the first electrical bus, and the second electrical signal can be a third phase signal representative of a third phase of power on the second electrical bus and a fourth phase signal representative of a fourth phase of power on the second electrical bus. For example, the electrical input port 118*a* can be connected to signals representative of two phases of the electrical network 30 (or representative of one phase of the electrical network 30 and ground), and the electrical input port 118*b* can be connected to signals representative of two phases of the electrical network 20 (or representative of one phase of the electrical network 20 and ground).

In some implementations, the process 400 can include disconnecting a second synchronization check relay from the first electrical signal and the second electrical signal before connecting the first electrical input port to the first electrical signal and before connecting the second electrical input port to the second electrical signal. For example, the synchro check relay 10 can be disconnected from the signals 22 and 32 before (or after) the signals 22 and 32 are connected to the electrical input ports 118*a* and 118*b*.

Figure 5:
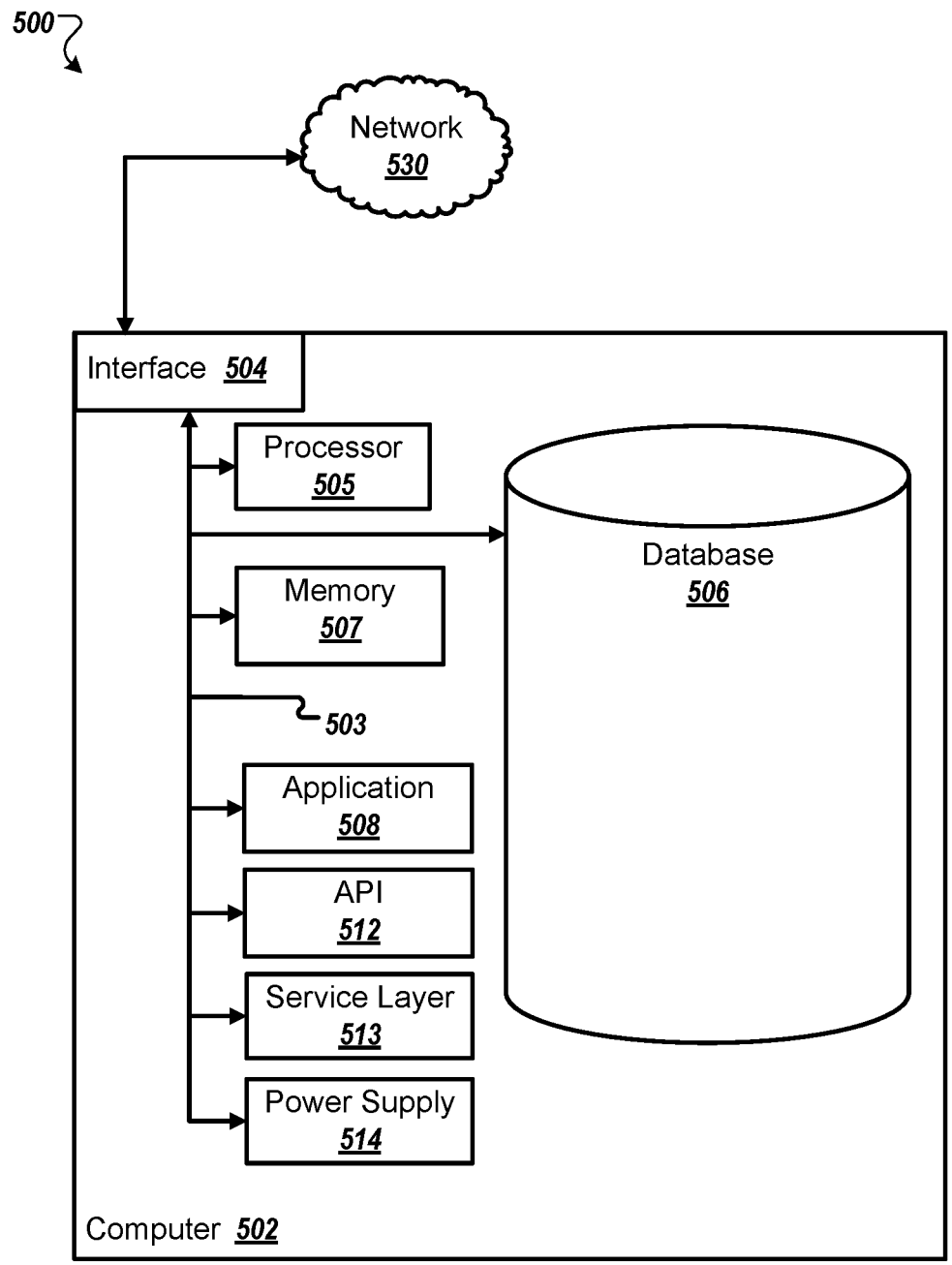
FIG. 5 is a block diagram illustrating an example computer system used to provide computational functionalities associated with described algorithms, methods, functions, processes, flows, and procedures as described in the present disclosure, according to some implementations of the present disclosure.

FIG. 5 is a block diagram of an example computer system 500 used to provide computational functionalities associated with described algorithms, methods, functions, processes, flows, and procedures described in the present disclosure, according to some implementations of the present disclosure. The illustrated computer 502 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 502 can include input devices such as keypads, keyboards, and touch screens that can accept user information. Also, the computer 502 can include output devices that can convey information associated with the operation of the computer 502. The information can include digital data, visual data, audio information, or a combination of information. The information can be presented in a graphical user interface (UI) (or GUI).

The computer 502 can serve in a role as a client, a network component, a server, a database, a persistency, or components of a computer system for performing the subject matter described in the present disclosure. The illustrated computer 502 is communicably coupled with a network 530. In some implementations, one or more components of the computer 502 can be configured to operate within different environments, including cloud-computing-based environments, local environments, global environments, and combinations of environments.

At a top level, the computer 502 is an electronic computing device operable to receive, transmit, process, store, and manage data and information associated with the described subject matter. According to some implementations, the computer 502 can also include, or be communicably coupled with, an application server, an email server, a web server, a caching server, a streaming data server, or a combination of servers.

The computer 502 can receive requests over network 530 from a client application (for example, executing on another computer 502). The computer 502 can respond to the received requests by processing the received requests using software applications. Requests can also be sent to the computer 502 from internal users (for example, from a command console), external (or third) parties, automated applications, entities, individuals, systems, and computers.

Each of the components of the computer 502 can communicate using a system bus 503. In some implementations, any or all of the components of the computer 502, including hardware or software components, can interface with each other or the interface 504 (or a combination of both) over the system bus 503. Interfaces can use an application programming interface (API) 512, a service layer 513, or a combination of the API 512 and service layer 513. The API 512 can include specifications for routines, data structures, and object classes. The API 512 can be either computer-language independent or dependent. The API 512 can refer to a complete interface, a single function, or a set of APIs.

The service layer 513 can provide software services to the computer 502 and other components (whether illustrated or not) that are communicably coupled to the computer 502. The functionality of the computer 502 can be accessible for all service consumers using this service layer. Software services, such as those provided by the service layer 513, can provide reusable, defined functionalities through a defined interface. For example, the interface can be software written in JAVA, C++, or a language providing data in extensible markup language (XML) format. While illustrated as an integrated component of the computer 502, in alternative implementations, the API 512 or the service layer 513 can be stand-alone components in relation to other components of the computer 502 and other components communicably coupled to the computer 502. Moreover, any or all parts of the API 512 or the service layer 513 can be implemented as child or sub-modules of another software module, enterprise application, or hardware module without departing from the scope of the present disclosure.

The computer 502 includes an interface 504. Although illustrated as a single interface 504 in FIG. 5, two or more interfaces 504 can be used according to particular needs, desires, or particular implementations of the computer 502 and the described functionality. The interface 504 can be used by the computer 502 for communicating with other systems that are connected to the network 530 (whether illustrated or not) in a distributed environment. Generally, the interface 504 can include, or be implemented using, logic encoded in software or hardware (or a combination of software and hardware) operable to communicate with the network 530. More specifically, the interface 504 can include software supporting one or more communication protocols associated with communications. As such, the network 530 or the interface's hardware can be operable to communicate physical signals within and outside of the illustrated computer 502.

The computer 502 includes a processor 505. Although illustrated as a single processor 505 in FIG. 5, two or more processors 505 can be used according to particular needs, desires, or particular implementations of the computer 502 and the described functionality. Generally, the processor 505 can execute instructions and can manipulate data to perform the operations of the computer 502, including operations using algorithms, methods, functions, processes, flows, and procedures as described in the present disclosure.

The computer 502 also includes a database 506 that can hold data for the computer 502 and other components connected to the network 530 (whether illustrated or not). For example, database 506 can be an in-memory, conventional, or a database storing data consistent with the present disclosure. In some implementations, database 506 can be a combination of two or more different database types (for example, hybrid in-memory and conventional databases) according to particular needs, desires, or particular implementations of the computer 502 and the described functionality. Although illustrated as a single database 506 in FIG. 5, two or more databases (of the same, different, or combination of types) can be used according to particular needs, desires, or particular implementations of the computer 502 and the described functionality. While database 506 is illustrated as an internal component of the computer 502, in alternative implementations, database 506 can be external to the computer 502.

The computer 502 also includes a memory 507 that can hold data for the computer 502 or a combination of components connected to the network 530 (whether illustrated or not). Memory 507 can store any data consistent with the present disclosure. In some implementations, memory 507 can be a combination of two or more different types of memory (for example, a combination of semiconductor and magnetic storage) according to particular needs, desires, or particular implementations of the computer 502 and the described functionality. Although illustrated as a single memory 507 in FIG. 5, two or more memories 507 (of the same, different, or combination of types) can be used according to particular needs, desires, or particular implementations of the computer 502 and the described functionality. While memory 507 is illustrated as an internal component of the computer 502, in alternative implementations, memory 507 can be external to the computer 502.

The application 508 can be an algorithmic software engine providing functionality according to particular needs, desires, or particular implementations of the computer 502 and the described functionality. For example, application 508 can serve as one or more components, modules, or applications. Further, although illustrated as a single application 508, the application 508 can be implemented as multiple applications 508 on the computer 502. In addition, although illustrated as internal to the computer 502, in alternative implementations, the application 508 can be external to the computer 502.

The computer 502 can also include a power supply 514. The power supply 514 can include a rechargeable or non-rechargeable battery that can be configured to be either user- or non-user-replaceable. In some implementations, the power supply 514 can include power-conversion and management circuits, including recharging, standby, and power management functionalities. In some implementations, the power-supply 514 can include a power plug to allow the computer 502 to be plugged into a wall socket or a power source to, for example, power the computer 502 or recharge a rechargeable battery.

There can be any number of computers 502 associated with, or external to, a computer system containing computer 502, with each computer 502 communicating over network 530. Further, the terms "client," "user," and other appropriate terminology can be used interchangeably, as appropriate, without departing from the scope of the present disclosure. Moreover, the present disclosure contemplates that many users can use one computer 502 and one user can use multiple computers 502.

Described implementations of the subject matter can include one or more features, alone or in combination.

For example, in a first implementation, an apparatus includes a housing, a first electrical input port, a second electrical input port, at least one trigger output port, and a synchronization check relay arranged at least partly within the housing and in electrical communication with the first electrical input port, the second electrical input ports, and the at least one trigger output port.

The foregoing and other described implementations can each, optionally, include one or more of the following features:

A first feature, combinable with any of the following features, where the synchronization check relay is configured to compare one or more of a first voltage, a first phase angle, a first frequency, and a first phase rotation of a first electrical signal in electrical communication with the first electrical input port with a corresponding one or more of a second voltage, a second phase angle, a second frequency, and a second phase rotation of a second electrical signal in electrical communication with the second electrical input port, and provide a trigger signal at the trigger output port based on the comparing.

A second feature, combinable with any of the previous or following features, where the comparing includes one or more of determining that the first voltage and the second voltage are within a predetermined voltage difference threshold, determining that the first phase angle and the second phase angle are within a predetermined phase angle difference threshold, determining that the first frequency and the second frequency are within a predetermined frequency difference threshold, and determining that the first phase rotation matches the second phase rotation.

A third feature, combinable with any of the previous or following features, including an indicator arranged at least partly in the housing and configured to provide an indication based on the trigger signal.

A fourth feature, combinable with any of the previous or following features, including a power inlet port, and a power switch arranged at least partly in the housing and configured to switch power to the synchronization check relay.

A fifth feature, combinable with any of the previous or following features, including one or both of a first display arranged at least partly in the housing and configured to display one or more of a first voltage, a first phase angle, a first frequency, and a first phase rotation of a first electrical signal in electrical communication with the first electrical input port, and a second display arranged at least partly in the housing and configured to display one or more of a second voltage, a second phase angle, a second frequency, and a second phase rotation of a second electrical signal in electrical communication with the second electrical input port.

A sixth feature, combinable with any of the previous or following features, where the first electrical input port is configured to removably electrically connect to a first power transducer, and the second electrical input port is configured to removably electrically connect to a second power transducer.

A seventh feature, combinable with any of the previous or following features, where the first electrical input port includes two inputs configured to receive two input signals representative of two phases of a multiphase electrical bus.

An eighth feature, combinable with any of the previous or following features, where the second electrical input port includes two inputs configured to receive two input signals representative of two phases of a multiphase electrical bus.

In a second implementation, a method of monitoring two electrical busses includes removably electrically connecting a synchronization check relay to a power source to receive operational power, removably electrically connecting a first electrical signal representative of a first power signal on a first electrical bus to a first electrical input port arranged in a housing and in electrical communication with a first sense input port of the synchronization check relay, removably electrically connecting a second electrical signal representative of a second power signal on a second electrical bus to a second electrical input port arranged in the housing and in electrical communication with a second sense input port of the synchronization check relay, comparing, by the synchronization check relay, the first electrical signal and the second electrical signal, determining, based on the comparing, electrical synchronization of the first electrical signal and the second electrical signal, and providing a trigger signal based on the determining.

The foregoing and other described implementations can each, optionally, include one or more of the following features:

A first feature, combinable with any of the following features, including removably electrically connecting a control input of a controllable switch to a trigger output port arranged in the housing and in electrical communication with a signal output port of the synchronization check relay, where the synchronization check relay is configured to provide the trigger signal at the signal output port.

A second feature, combinable with any of the previous or following features, including electrically connecting, by the controllable switch based on the trigger signal, the first electrical bus to the second electrical bus.

A third feature, combinable with any of the previous or following features, including displaying information representative of one or more of a first voltage of the first power signal based on the first electrical signal, a first phase angle of the first power signal based on the first electrical signal, a first frequency of the first power signal based on the first electrical signal, a first phase rotation of the first electrical signal based on the first electrical signal, a second voltage of the second power signal based on the second electrical signal, a second phase angle of the second power signal based on the second electrical signal, a second frequency of the second power signal based on the second electrical signal, and a second phase rotation of the second electrical signal based on the second electrical signal.

A fourth feature, combinable with any of the previous or following features, including providing an indication based on the determining.

A fifth feature, combinable with any of the previous or following features, including actuating a power switch configured to selectably open and close an electrical circuit between the power source and the synchronization check relay.

A sixth feature, combinable with any of the previous or following features, where the first electrical signal includes a first phase signal representative of a first phase of power on the first electrical bus and a second phase signal representative of a second phase of power on the first electrical bus, and the second electrical signal includes a third phase signal representative of a third phase of power on the second electrical bus and a fourth phase signal representative of a fourth phase of power on the second electrical bus.

A seventh feature, combinable with any of the previous or following features, including disconnecting a second synchronization check relay from the first electrical signal and the second electrical signal before connecting the first electrical input port to the first electrical signal and before connecting the second electrical input port to the second electrical signal.

In a third implementation, a synchronization check relay system includes a housing, a first reception means for receiving a first measurement signal based on a first power signal of a first electrical bus, and arranged at least partly within the housing, a second reception means for receiving a second measurement signal based on a second power signal of a second electrical bus, and arranged at least partly within the housing, a determination means for determining electrical synchronization between the first power signal and the second power signal based on the first measurement signal and the second measurement signal, and an output means for providing a trigger signal indicative of determined electrical synchronization between the first power signal and the second power signal.

The foregoing and other described implementations can each, optionally, include one or more of the following features:

A first feature, combinable with any of the following features, including a power means for receiving power from a power source and distributing received power to the determination means.

A second feature, combinable with any of the previous or following features, including a communication means for providing information to a user about one or more of a first voltage of the first power signal, a first phase angle of the first power signal, a first frequency of the first power signal, a first phase rotation of the first electrical signal, a second voltage of the second power signal, a second phase angle of the second power signal, a second frequency of the second power signal, and a second phase rotation of the second electrical signal.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as standalone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/nonvolatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some, or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. An apparatus comprising:
   a housing;
   a first electrical input port configured to removably electrically connect to a first power transducer;
   a second electrical input port configured to removably electrically connect to a second power transducer;
   at least one trigger output port; and
   a synchronization check relay arranged at least partly within the housing and in electrical communication with the first electrical input port, the second electrical input ports, and the at least one trigger output port.

2. The apparatus of claim 1, wherein the synchronization check relay is configured to:
   compare one or more of a first voltage, a first phase angle, a first frequency, and a first phase rotation of a first electrical signal in electrical communication with the first electrical input port with a corresponding one or more of a second voltage, a second phase angle, a second frequency, and a second phase rotation of a second electrical signal in electrical communication with the second electrical input port; and
   provide a trigger signal at the trigger output port based on the comparing.

3. The apparatus of claim 2, wherein the comparing further comprises one or more of:
   determining that the first voltage and the second voltage are within a predetermined voltage difference threshold;
   determining that the first phase angle and the second phase angle are within a predetermined phase angle difference threshold;
   determining that the first frequency and the second frequency are within a predetermined frequency difference threshold; and
   determining that the first phase rotation matches the second phase rotation.

4. The apparatus of claim 2, further comprising an indicator arranged at least partly in the housing and configured to provide an indication based on the trigger signal.

5. The apparatus of claim 1, further comprising:
   a power inlet port; and
   a power switch arranged at least partly in the housing and configured to switch power to the synchronization check relay.

6. The apparatus of claim 1, further comprising one or both of:
   a first display arranged at least partly in the housing and configured to display one or more of a first voltage, a first phase angle, a first frequency, and a first phase rotation of a first electrical signal in electrical communication with the first electrical input port; and
   a second display arranged at least partly in the housing and configured to display one or more of a second voltage, a second phase angle, a second frequency, and a second phase rotation of a second electrical signal in electrical communication with the second electrical input port.

7. The apparatus of claim 1, wherein the first electrical input port comprises two inputs configured to receive two input signals representative of two phases of a multiphase electrical bus.

8. The apparatus of claim 1, wherein the second electrical input port comprises two inputs configured to receive two input signals representative of two phases of a multiphase electrical bus.

9. A method of monitoring two electrical busses, the method comprising:
   disconnecting a first synchronization check relay from a first electrical signal representative of a first power signal on a first electrical bus;
   disconnecting the first synchronization check relay from a second electrical signal representative of a second power signal on a second electrical bus;
   removably electrically connecting a second synchronization check relay, arranged in a housing, to a power source to receive operational power;
   removably electrically connecting the first electrical signal to a first sense input port of the second synchronization check relay after disconnecting the first synchronization check relay from the first electrical signal;
   removably electrically connecting the second electrical signal to a second sense input port of the second synchronization check relay after disconnecting the first synchronization check relay from the first electrical signal;
   comparing, by the second synchronization check relay, the first electrical signal and the second electrical signal;
   determining, based on the comparing, electrical synchronization of the first electrical signal and the second electrical signal; and
   providing a trigger signal based on the determining.

10. The method of claim 9, further comprising removably electrically connecting a control input of a controllable switch to a trigger output port arranged in the housing and in electrical communication with a signal output port of the second synchronization check relay, wherein the second synchronization check relay is configured to provide the trigger signal at the signal output port.

11. The method of claim 10, further comprising electrically connecting, by the controllable switch based on the trigger signal, the first electrical bus to the second electrical bus.

12. The method of claim 9, further comprising displaying information representative of one or more of:
- a first voltage of the first power signal based on the first electrical signal;
- a first phase angle of the first power signal based on the first electrical signal;
- a first frequency of the first power signal based on the first electrical signal;
- a first phase rotation of the first electrical signal based on the first electrical signal;
- a second voltage of the second power signal based on the second electrical signal;
- a second phase angle of the second power signal based on the second electrical signal;
- a second frequency of the second power signal based on the second electrical signal; and
- a second phase rotation of the second electrical signal based on the second electrical signal.

13. The method of claim 9, further comprising providing an indication based on the determining.

14. The method of claim 9, further comprising actuating a power switch configured to selectably open and close an electrical circuit between the power source and the second synchronization check relay.

15. The method of claim 9, wherein the first electrical signal comprises a first phase signal representative of a first phase of power on the first electrical bus and a second phase signal representative of a second phase of power on the first electrical bus, and the second electrical signal comprises a third phase signal representative of a third phase of power on the second electrical bus and a fourth phase signal representative of a fourth phase of power on the second electrical bus.

16. A synchronization check relay system comprising:
- a housing;
- a first reception means for removably electrically connecting to a first power transducer and for receiving a first measurement signal from the first power transducer based on a first power signal of a first electrical bus, and arranged at least partly within the housing;
- a second reception means for removably electrically connecting to a second power transducer and for receiving a second measurement signal from the second power transducer based on a second power signal of a second electrical bus, and arranged at least partly within the housing;
- a determination means for determining electrical synchronization between the first power signal and the second power signal based on the first measurement signal and the second measurement signal; and
- an output means for providing a trigger signal indicative of determined electrical synchronization between the first power signal and the second power signal.

17. The synchronization check relay system of claim 16, further comprising a power means for receiving power from a power source and distributing received power to the determination means.

18. The synchronization check relay system of claim 16, further comprising a communication means for providing information to a user about one or more of:
- a first voltage of the first power signal;
- a first phase angle of the first power signal;
- a first frequency of the first power signal;
- a first phase rotation of the first electrical signal;
- a second voltage of the second power signal;
- a second phase angle of the second power signal;
- a second frequency of the second power signal; and
- a second phase rotation of the second electrical signal.

* * * * *